(12) United States Patent
Marsh

(10) Patent No.: US 6,884,691 B2
(45) Date of Patent: Apr. 26, 2005

(54) METHOD OF FORMING A SUBSTRATE HAVING A SURFACE COMPRISING AT LEAST ONE OF PT, PD, CO AND AU IN AT LEAST ONE OF ELEMENTAL AND ALLOY FORMS

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 100 days.

(21) Appl. No.: 10/392,047

(22) Filed: Mar. 18, 2003

(65) Prior Publication Data

US 2004/0185636 A1 Sep. 23, 2004

(51) Int. Cl.⁷ ............................ H01L 21/20; H01L 21/44
(52) U.S. Cl. ...................... 438/398; 438/665; 438/720; 438/964
(58) Field of Search ............................... 438/398, 720, 438/255, 964, 665

(56) References Cited

U.S. PATENT DOCUMENTS

| | | |
|---|---|---|
| 5,149,854 A * | 9/1992 | Nappier ..................... 556/49 |
| 5,431,774 A * | 7/1995 | Douglas ..................... 216/57 |
| 5,705,443 A | 1/1998 | Stauf et al. ................. 438/720 |
| 5,990,559 A | 11/1999 | Marsh ........................ 257/768 |
| 6,074,945 A | 6/2000 | Vaartstra et al. |
| 6,204,172 B1 | 3/2001 | Marsh |
| 6,204,178 B1 | 3/2001 | Marsh |
| 6,218,297 B1 | 4/2001 | Marsh |
| 6,271,131 B1 | 8/2001 | Uhlenbrock et al. |
| 6,281,161 B1 | 8/2001 | Marsh |
| 6,284,655 B1 | 9/2001 | Marsh |
| 6,294,425 B1 * | 9/2001 | Hideki ....................... 438/253 |
| 6,318,381 B1 | 11/2001 | Marsh |
| 6,387,802 B1 | 5/2002 | Marsh |
| 6,403,414 B2 | 6/2002 | Marsh |
| 6,429,071 B1 * | 8/2002 | Sharan et al. ............... 438/255 |
| 6,495,458 B2 | 12/2002 | Marsh |
| 6,517,616 B2 | 2/2003 | Marsh et al. |
| 6,528,786 B2 | 3/2003 | Marsh |
| 6,541,067 B1 | 4/2003 | Marsh et al. |
| 6,569,689 B2 | 5/2003 | Marsh |
| 6,583,022 B1 | 6/2003 | Marsh |
| 6,635,561 B2 * | 10/2003 | Kawai et al. ............... 438/622 |
| 6,642,567 B1 | 11/2003 | Marsh |
| 6,660,631 B1 | 12/2003 | Marsh |
| 6,673,701 B1 | 1/2004 | Marsh et al. |
| 6,677,252 B2 | 1/2004 | Marsh |
| 6,690,055 B1 | 2/2004 | Uhlenbrock et al. |
| 6,737,313 B1 | 5/2004 | Marsh et al. |
| 6,783,657 B2 | 8/2004 | Marsh et al. |

* cited by examiner

Primary Examiner—Michael Trinh
(74) Attorney, Agent, or Firm—Wells St. John P.S.

(57) ABSTRACT

The invention includes methods of forming a substrate having a surface comprising at least one of Pt, Pd, Co and Au in at least one of elemental and alloy forms. In one implementation, a substrate is provided which has a first substrate surface comprising at least one of Pt, Pd, Co and Au in at least one of elemental and alloy forms. The first substrate surface has a first degree of roughness. Within a chamber, the first substrate surface is exposed to a $PF_3$ comprising atmosphere under conditions effective to form a second substrate surface comprising at least one of Pt, Pd, Co and Au in at least one of elemental and alloy forms which has a second degree of roughness which is greater than the first degree of roughness. The substrate having the second substrate surface with the second degree of roughness is ultimately removed from the chamber.

74 Claims, 3 Drawing Sheets

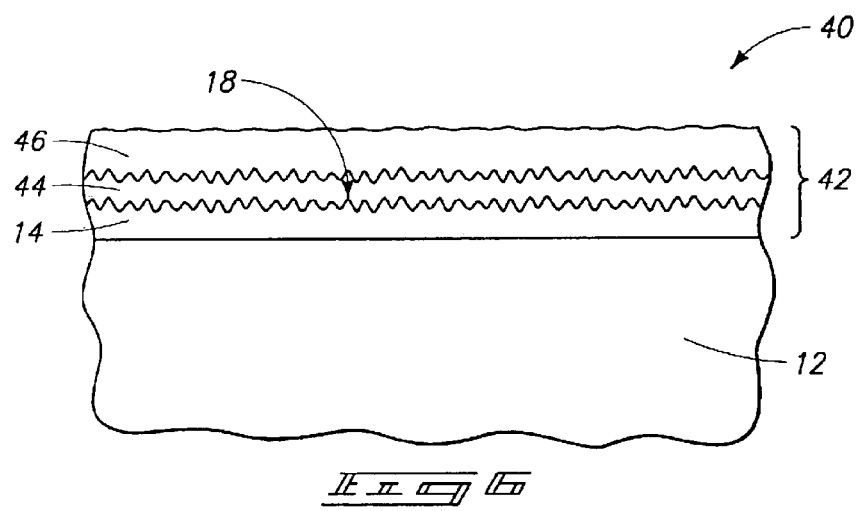

METHOD OF FORMING A SUBSTRATE HAVING A SURFACE COMPRISING AT LEAST ONE OF PT, PD, CO AND AU IN AT LEAST ONE OF ELEMENTAL AND ALLOY FORMS

TECHNICAL FIELD

This invention relates to methods of forming a substrate having a surface comprising at least one of Pt, Pd, Co and Au in at least one of elemental and alloy forms.

BACKGROUND OF THE INVENTION

Integrated circuits are typically formed on a semiconductor substrate such as a silicon wafer or other semiconducting material. In general, layers of various materials which are either semiconducting, conducting or insulating are utilized to form the integrated circuits. By way of example, the various materials are doped, ion implanted, deposited, etched, grown, etc. using various processes. A continuing goal in semiconductor processing is to reduce the size of individual electronic components thereby enabling smaller and denser integrated circuitry.

One type of circuit device is a capacitor. As capacitors continue to get smaller, there is a continuing challenge to attain sufficient capacitance despite decreasing size. This has been approached both by developing improved materials and in the physical design of the capacitor, for example utilizing stacked and trenched constructions. A capacitor's capacitance is inherently a function of the amount of surface area between the electrodes and the capacitor dielectric region. Rougher surfaces have inherently higher surface areas than do smoother surfaces. Accordingly, increasing the degree of surface roughness of the capacitor electrodes is recognized as one way of facilitating maximum capacitance between an electrode and a capacitor dielectric region. This invention is directed to a method of increasing the surface roughness of certain metals.

While the invention was motivated in addressing the above issues, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes methods of forming a substrate having a surface comprising at least one of Pt, Pd, Co and Au in at least one of elemental and alloy forms. In one implementation, a substrate is provided which has a first substrate surface comprising at least one of Pt, Pd, Co and Au in at least one of elemental and alloy forms. The first substrate surface has a first degree of roughness. Within a chamber, the first substrate surface is exposed to a $PF_3$ comprising atmosphere under conditions effective to form a second substrate surface comprising at least one of Pt, Pd, Co and Au in at least one of elemental and alloy forms which has a second degree of roughness which is greater than the first degree of roughness. The substrate having the second substrate surface with the second degree of roughness is ultimately removed from the chamber.

Other aspects and implementations are contemplated.

BRIEF DESCRIPTION OF THE DRAWINGS

Preferred embodiments of the invention are described below with reference to the following accompanying drawings.

FIG. 6 is a diagrammatic sectional view of a semiconductor wafer fragment at a processing step in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
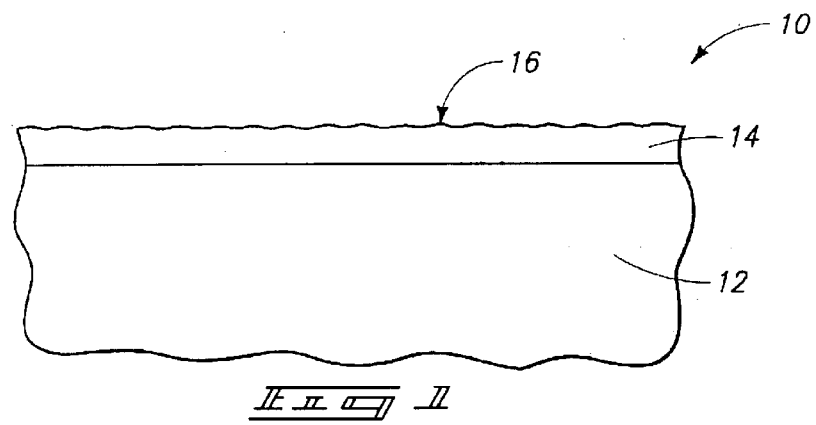
FIG. 1 is a diagrammatic sectional view of a semiconductor wafer fragment at a processing step in accordance with an aspect of the invention.
Figure 2:
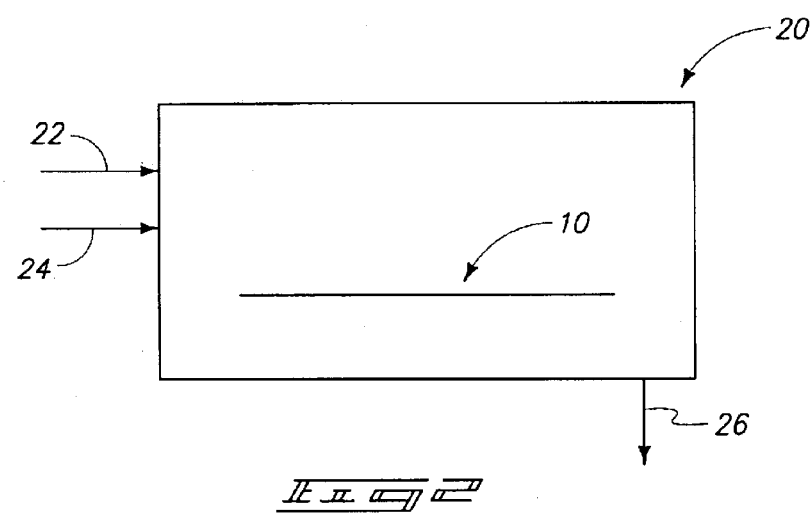
FIG. 2 is a diagrammatic depiction of a processing chamber.
Figure 3:
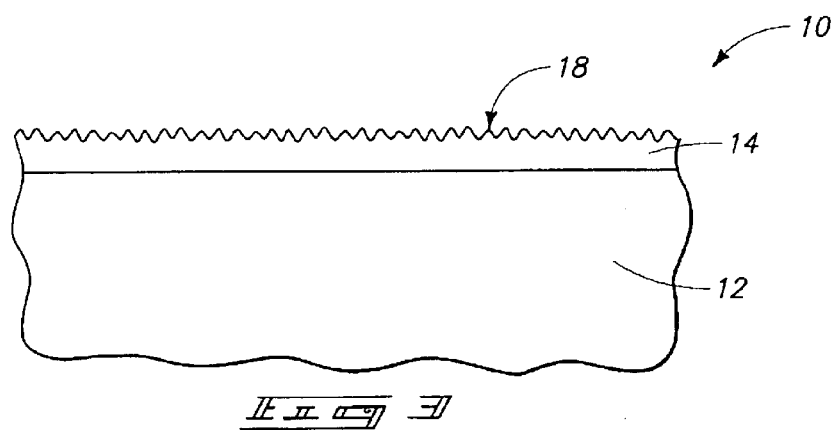
FIG. 3 is a view of the FIG. 1 wafer fragment at a processing step subsequent to that depicted by FIG. 1.

By way of example only, first exemplary preferred embodiments of methods of forming a substrate having a surface comprising at least one of Pt, Pd, Co and Au in at least one of elemental and alloy forms are described initially with reference to FIGS. 1–3. FIG. 1 depicts a substrate 10 comprising a base substrate 12 and a layer 14 formed thereon. Base substrate 12 might constitute a semiconductive substrate, for example bulk monocrystalline silicon material. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated.

Layer 14 has been formed over base substrate 12 and comprises a first substrate surface 16 which, in the preferred embodiment, is outwardly exposed. First substrate surface 16 comprises at least one of Pt, Pd, Co and Au in at least one of elemental and alloy forms. First substrate surface 16 also has some first degree of roughness as either initially deposited or resulting from any subsequent processing. Accordingly in the context of this document, reference to "first degree of roughness" is to be interpreted temporally relative to a "second degree of roughness" described below, and not necessarily relative to a first ever or initial degree of roughness.

The invention was initially reduced-to-practice in the fabrication of metal layers consisting essentially of elemental platinum. Such platinum was deposited upon a substrate by atomic layer deposition. Such encompasses the deposition of successive self-limiting monolayers over a substrate within a deposition chamber typically maintained at subatmospheric pressure. Successive mono-atomic layers are chemically adsorbed to a substrate and/or reacted with the outer layer on the substrate typically by the successive feeding of different deposition precursors to the substrate surface. The individual mono-atomic layers might not completely cover a substrate surface or a portion of a substrate surface of intended deposition during a single deposition precursor feeding. In accordance with the reduction-to-practice example, the particular method for depositing the platinum utilized a platinum precursor comprising methylcyclopentadienyltrimethylplatinum (MeCpPt[Me]$_3$). Such precursor, at a temperature of 45° C., was fed to a chamber within which the substrate was received over a 2 second period at a chamber pressure of about $1 \times 10^{-3}$ Torr, with the substrate being at a temperature of 190° C. This was followed by approximately 2 seconds of not feeding any precursor or purge gas to the chamber, resulting in a chamber pressure of $1 \times 10^{-6}$ Torr. Such was followed by a 1 second feed of $O_2$ at a pressure of $1 \times 10^{-3}$ Torr, followed by a 2 second step in which no precursor or purge gas was fed to the chamber. Such individual cycle resulted in a platinum monolayer at least partially forming over the substrate. Repeating the sequence was repeatedly conducted to result in the deposition of an exemplary layer 14 to a thickness of 500 Angstroms over some substrate 12. Such is provided by way of example only, with any other method of forming a layer 14 with an outer surface 16 being contemplated. Such a surface 14 might constitute any one or combination of Pt, Pd, Co and Au, including in combination with any other metals, in at least one of elemental and alloy forms.

In accordance with one implementation, substrate 10 is provided within a suitable chamber 20. Chamber 20 is shown by example only, and might constitute a chamber within which layer 14 and/or outer surface 16 of the first degree of roughness is formed. Alternately, chamber 20 might constitute a different chamber. By way of example only, chamber 20 is diagrammatically depicted as having gas inlets 22 and 24, and an exhaust line 26. Any chamber 20 is contemplated, whether existing or yet-to-be developed, and of course with any number of inlets, outlets, etc. Within chamber 20, first substrate surface 16 is exposed to a $PF_3$ comprising atmosphere under conditions effective to form a second substrate surface 18 (FIG. 3) comprising at least one of Pt, Pd, Co and Au in at least one of elemental and alloy forms which has a second degree of roughness that is greater than the first degree of roughness. First substrate surface 16 might be outwardly exposed during the $PF_3$ exposing. Alternately, the first substrate surface exposing might be through a thin or other layer formed over first substrate surface 16 and through which $PF_3$ can diffuse.

In one preferred embodiment, the atmosphere consists essentially of $PF_3$. In another preferred embodiment, the atmosphere consists essentially of $PF_3$ and at least one of $N_2$ and a noble gas. The atmosphere might comprise plasma energized $PF_3$, or alternately be void of plasma energized $PF_3$. Further, if plasma generated $PF_3$ is utilized, such might be generated within chamber 20 or remotely therefrom. Further, any form of plasma generation is contemplated whether existing or yet-to-be developed. Regardless, where plasma generation is utilized, a preferred substrate temperature is from about 200° C. to about 450° C. (with from about 250° C. to about 350° C. being more preferred), and a preferred chamber pressure is less than or equal to about 2 Torr. Where the atmosphere is void of plasma energized $PF_3$, an exemplary preferred substrate temperature is from about 300° C. to about 500° C., with a preferred chamber pressure being less than or equal about 10 Torr. However, pressures at or above ambient room pressure are also contemplated, for example (and by way of example only) when above room ambient pressure at 5000 Torr and higher.

Figure 4:
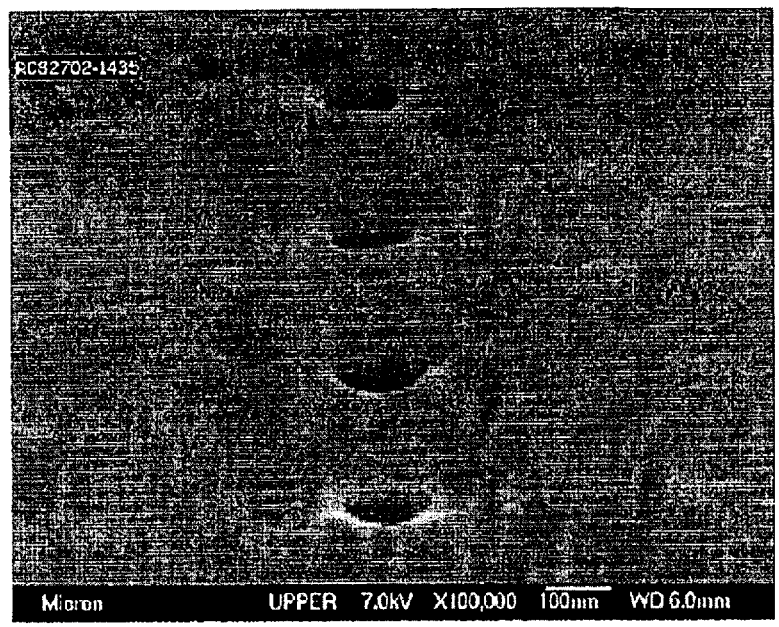
FIG. 4 is a scanning electron micrograph of an exemplary substrate surface that has not been treated in accordance with an aspect of the invention.
Figure 5:
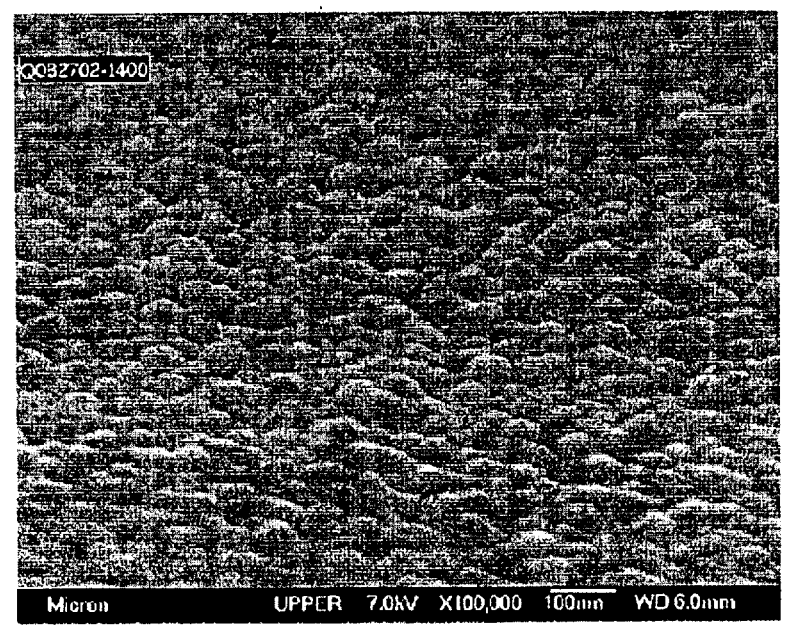
FIG. 5 is a scanning electron micrograph of an exemplary substrate surface that has resulted from treatment in accordance with an aspect of the invention.

The invention was reduced-to-practice in a 1 liter chamber using a sample substrate having an exposed outer surface 16 of elemental platinum. The reactor was a custom laboratory chamber using remote inductively coupled plasma powered at 350 Watts. The only gas flowed to the chamber was $PF_3$ at room temperature at a flow rate of 50 sccm and providing an internal chamber pressure of 0.2 Torr. The substrate temperature was 300° C. The substrate was treated in this manner for 90 seconds. By way of example only, FIG. 4 depicts a scanning electron micrograph showing an exemplary first substrate surface of a first degree of roughness formed by the exemplary above-described atomic layer deposition method. FIG. 5 depicts a different second substrate, although deposited using the above-described atomic layer deposition method, but after the above exemplary exposing to $PF_3$ resulting in a second degree of roughness that is perceptibly greater than the first degree of roughness.

Without being limited by any theory of invention, the following are provided as examples or theories by which the roughening action might be occurring. In one possibility, $PF_3$ might be attacking the outer metal surface (M) forming a volatile $M(PF_3)_4$ species which leaves the surface. Further and yet, some of this volatile material might end up redepositing as the metal M. In another possibility, perhaps the $PF_3$ is attacking grain boundaries at the metal surface resulting in a roughening effect. Further, such might be a combination of these two theories, or other theories alone or in combination.

After exposing the first substrate surface to a $PF_3$ comprising atmosphere, for example as described above, the substrate can be removed from the treating chamber. Some material might be formed over the substrate on (meaning in contact with) the second substrate surface having the second degree of roughness if such is outwardly exposed, and such material might be formed within the chamber of treatment prior to removing it therefrom, or in a different chamber. Alternately, no material might be subsequently formed on the second substrate surface having the second degree of roughness, depending upon the application.

The invention was motivated in the context of capacitor fabrication, and accordingly in using the second substrate surface in a capacitor. By way of example only, FIG. 6 depicts an exemplary substrate 40 in the fabrication of a capacitor 42. Like numerals from the first described embodiment are utilized where appropriate, with differences being indicated with different numerals. Substrate or wafer fragment 40 comprises a first conductive capacitor electrode layer 14 which has been processed in the above-described exemplary manner to form a first capacitor electrode layer second surface 18 comprising at least one of Pt, Pd, Co and Au in at least one of elemental and alloy forms. All other exemplary preferred attributes as described above can be utilized in the fabrication of a capacitor in conjunction with the FIG. 6 construction. A capacitor dielectric layer 44 is formed over capacitor electrode layer second surface 18. An exemplary material is $Ta_2O_5$. A second conductive capacitor electrode layer 46 has been formed over capacitor dielectric layer 44. Such might be the same or different in composition to that of layer 14. Of course, multiple layers might constitute any of layers 14, 44 and 46 in fabricating any exemplary existing or yet-to-be developed capacitor construction. One exemplary preferred capacitor is a metal-insulator-metal construction capacitor.

While the invention was initially motivated from a desire to roughen certain surfaces in the fabrication of a capacitor, the invention is in no way so limited. Accordingly, the invention has applicability in methods of forming any substrate having some surface at least a portion of which comprises one of Pt, Pd, Co and Au in at least one of elemental and alloy forms. By way of example only, such surfaces might be utilized in automotive catalytic converters, fuel cells, and as heterogeneous catalysts in chemical processing.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a substrate having a surface comprising at least one of Pt, Pd, Co and Au in at least one of elemental and alloy forms, comprising:
   providing a substrate having a first substrate surface comprising at least one of Pt, Pd, Co and Au in at least one of elemental and alloy forms, the first substrate surface having a first degree of roughness;
   within a chamber, exposing the first substrate surface to a $PF_3$ comprising atmosphere under conditions effective to form a second substrate surface comprising at least one of Pt, Pd, Co and Au in at least one of elemental and alloy forms which has a second degree of roughness which is greater than the first degree of roughness; and
   removing the substrate having the second substrate surface with the second degree of roughness from the chamber.

2. The method of claim 1 wherein the atmosphere consists essentially of $PF_3$.

3. The method of claim 1 wherein the atmosphere consists essentially of $PF_3$ and at least one of $N_2$ and a noble gas.

4. The method of claim 1 wherein the first substrate surface is outwardly exposed during the exposing.

5. The method of claim 1 wherein the first substrate surface is not outwardly exposed during the exposing.

6. The method of claim 1 wherein the atmosphere comprises plasma energized $PF_3$.

7. The method of claim 6 comprising $PF_3$ plasma generation within the chamber.

8. The method of claim 6 comprising $PF_3$ plasma generation remote from the chamber.

9. The method of claim 6 wherein the exposing comprises a substrate temperature of from about 200° C. to about 450° C.

10. The method of claim 6 wherein the exposing comprises a substrate temperature of from about 250° C. to about 350° C.

11. The method of claim 6 wherein the exposing comprises a chamber pressure of less than or equal to about 2 Torr.

12. The method of claim 6 wherein the exposing comprises a substrate temperature of from about 200° C. to about 450° C. and a chamber pressure of less than or equal to about 2 Torr.

13. The method of claim 1 wherein the atmosphere is void of plasma energized $PF_3$.

14. The method of claim 13 wherein the exposing comprises a substrate temperature of from about 300° C. to about 500° C.

15. The method of claim 13 wherein the exposing comprises a chamber pressure of less than or equal to about 10 Torr.

16. The method of claim 13 wherein the exposing comprises a substrate temperature of from about 300° C. to about 500° C., and a chamber pressure of less than or equal to about 10 Torr.

17. The method of claim 13 wherein the conditions comprise pressure greater than room ambient pressure.

18. The method of claim 17 wherein the pressure comprises at least 5000 Torr.

19. The method of claim 1 wherein the first and second substrate surfaces comprise Pt.

20. The method of claim 19 wherein the Pt is in elemental form.

21. The method of claim 19 wherein the Pt is in alloy form.

22. The method of claim 1 wherein the first and second substrate surfaces comprise Pd.

23. The method of claim 22 wherein the Pd is in elemental form.

24. The method of claim 22 wherein the Pd is in alloy form.

25. The method of claim 1 wherein the first and second substrate surfaces comprise Co.

26. The method of claim 25 wherein the Co is in elemental form.

27. The method of claim 25 wherein the Co is in alloy form.

28. The method of claim 1 wherein the first and second substrate surfaces comprise Au.

29. The method of claim 28 wherein the Au is in elemental form.

30. The method of claim 28 wherein the Au is in alloy form.

31. The method of claim 1 wherein the first substrate surface is formed by atomic layer deposition.

32. The method of claim 31 wherein the atmosphere comprises plasma energized $PF_3$.

33. The method of claim 1 wherein the conditions comprise room ambient pressure.

34. The method of claim 1 comprising using the second substrate surface in a capacitor.

35. The method of claim 1 comprising using the second substrate surface in an automotive catalytic converter.

36. The method of claim 1 comprising using the second substrate surface in a fuel cell.

37. The method of claim 1 comprising using the second substrate surface as a heterogeneous catalyst.

38. A method of forming a substrate having a surface comprising at least one of Pt, Pd, Co and Au in at least one of elemental and alloy forms, comprising:
   providing a substrate having a first substrate surface comprising at least one of Pt, Pd, Co and Au in at least one of elemental and alloy forms, the first substrate surface having a first degree of roughness;
   exposing the first substrate surface to a $PF_3$ comprising atmosphere under conditions effective to form a second substrate surface comprising at least one of Pt, Pd, Co and Au in at least one of elemental and alloy forms which has a second degree of roughness which is greater than the first degree of roughness; and
   forming material over the substrate on the second substrate surface having the second degree of roughness.

39. The method of claim 38 wherein the atmosphere consists essentially of $PF_3$.

40. The method of claim 38 wherein the atmosphere consists essentially of $PF_3$ and at least one of $N_2$ and a noble gas.

41. The method of claim 38 wherein the first substrate surface is outwardly exposed during the exposing.

42. The method of claim 38 wherein the first substrate surface is not outwardly exposed during the exposing.

43. The method of claim 38 wherein the atmosphere comprises plasma energized $PF_3$.

44. The method of claim 43 comprising $PF_3$ plasma generation within a chamber within which the substrate is received during the exposing.

45. The method of claim 43 comprising $PF_3$ plasma generation remote from a chamber within which the substrate is received during the exposing.

46. The method of claim 43 wherein the exposing comprises a substrate temperature of from about 200° C. to about 450° C.

47. The method of claim 43 wherein the exposing comprises a substrate temperature of from about 250° C. to about 350° C.

48. The method of claim 43 wherein the exposing comprises a pressure of less than or equal to about 2 Torr.

49. The method of claim 43 wherein the exposing comprises a substrate temperature of from about 200° C. to about 450° C. and a pressure of less than or equal to about 2 Torr.

50. The method of claim 38 wherein the atmosphere is void of plasma energized $PF_3$.

51. The method of claim 50 wherein the exposing comprises a substrate temperature of from about 300° C. to about 500° C.

52. The method of claim 50 wherein the exposing comprises a pressure of less than or equal to about 10 Torr.

53. The method of claim 50 wherein the exposing comprises a substrate temperature of from about 300° C. to about 500° C., and a pressure of less than or equal to about 10 Torr.

54. The method of claim 50 wherein the conditions comprise pressure greater than room ambient pressure.

55. The method of claim 54 wherein the pressure comprises at least 5000 Torr.

56. The method of claim 38 wherein the first and second substrate surfaces comprise Pt.

57. The method of claim 56 wherein the Pt is in elemental form.

58. The method of claim 56 wherein the Pt is in alloy form.

59. The method of claim 38 wherein the first and second substrate surfaces comprise Pd.

60. The method of claim 59 wherein the Pd is in elemental form.

61. The method of claim 59 wherein the Pd is in alloy form.

62. The method of claim 38 wherein the first and second substrate surfaces comprise Co.

63. The method of claim 62 wherein the Co is in elemental form.

64. The method of claim 62 wherein the Co is in alloy form.

65. The method of claim 38 wherein the first and second substrate surfaces comprises Au.

66. The method of claim 65 wherein the, Au is in elemental form.

67. The method of claim 65 wherein the Au is in alloy form.

68. The method of claim 38 wherein the first substrate surface is formed by atomic layer deposition.

69. The method of claim 68 wherein the atmosphere comprises plasma energized $PF_3$.

70. The method of claim 38 comprising using the second substrate surface in a capacitor.

71. The method of claim 38 comprising using the second substrate surface in an automotive catalytic converter.

72. The method of claim 38 comprising using the second substrate surface in a fuel cell.

73. The method of claim 38 comprising using the second substrate surface as a heterogeneous catalyst.

74. A method of forming a capacitor, comprising:

providing a first conductive capacitor electrode layer over a substrate, the first conductive capacitor electrode layer having a first surface comprising at least one of Pt, Pd, Co and Au in at least one of elemental and alloy forms, the first surface having a first degree of roughness;

exposing the first surface to a $PF_3$ comprising atmosphere under conditions effective to form a first capacitor electrode layer second surface comprising at least one of Pt, Pd, Co and Au in at least one of elemental and alloy forms which has a second degree of roughness which is greater than the first degree of roughness;

forming a capacitor dielectric layer over the capacitor electrode layer second surface; and forming a second conductive capacitor electrode layer over the capacitor dielectric layer.

* * * * *

UNITED STATES PATENT AND TRADEMARK OFFICE
CERTIFICATE OF CORRECTION

PATENT NO. : 6,884,691 B2
DATED : April 26, 2005
INVENTOR(S) : Marsh

It is certified that error appears in the above-identified patent and that said Letters Patent is hereby corrected as shown below:

Column 3,
Line 9, please delete "a," after "to" and insert -- a --.

Signed and Sealed this

Eighth Day of November, 2005

JON W. DUDAS
*Director of the United States Patent and Trademark Office*